(12) United States Patent
Cheng et al.

(10) Patent No.: US 7,686,909 B2
(45) Date of Patent: Mar. 30, 2010

(54) REEL-TYPE PACKAGE OF FLEXIBLE PRINTED CIRCUIT BOARDS AND METHOD FOR SUPPLYING THEREOF

(75) Inventors: Ping-Chin Cheng, Taipei Hsien (TW); Sheng-Hsiung Ho, Hsinchu Hsien (TW); Chin-Chen Yang, Chu Pei (TW)

(73) Assignee: AU Optronics Corp., Hsinchu (TW)

( * ) Notice: Subject to any disclaimer, the term of this patent is extended or adjusted under 35 U.S.C. 154(b) by 216 days.

(21) Appl. No.: 11/896,498

(22) Filed: Sep. 4, 2007

(65) Prior Publication Data

US 2007/0295444 A1  Dec. 27, 2007

Related U.S. Application Data

(62) Division of application No. 10/462,629, filed on Jun. 17, 2003, now abandoned.

(30) Foreign Application Priority Data

Mar. 11, 2003  (TW) .............................. 92105248 A

(51) Int. Cl.
*B32B 38/04* (2006.01)
(52) U.S. Cl. ................... 156/193; 156/259; 156/271

(58) Field of Classification Search ................. 156/193, 156/250, 259, 271; 83/13; 242/444.1, 444.3, 242/444, 443.1; 29/592.1; 438/46, 113, 438/118
See application file for complete search history.

(56) References Cited

U.S. PATENT DOCUMENTS

| | | | | |
|---|---|---|---|---|
| 5,338,381 A | * | 8/1994 | Hidese | ......................... 156/64 |
| 5,342,460 A | * | 8/1994 | Hidese | ......................... 156/64 |
| 5,948,526 A | * | 9/1999 | Wilheim et al. | ............. 428/352 |
| 2003/0102424 A1 | * | 6/2003 | Izumi et al. | ............... 250/208.1 |

FOREIGN PATENT DOCUMENTS

TW  500290  8/2002

* cited by examiner

*Primary Examiner*—George R Koch, III
(74) *Attorney, Agent, or Firm*—Thomas, Kayden, Horstemeyer & Risley

(57) ABSTRACT

A method for reel-type packaging flexible printed circuit boards (FPCs) is disclosed. Firstly, a flexible plate having a plurality of FPC patterns is cut out to form several bar-like materials, wherein each of the bar-like materials has a plurality of aligned FPCs thereon. Subsequently, the bar-like materials are wound onto a reel one by one to form a reel-type package so as to prevent the FPCs from crumpling, curving and deforming when suffering an external force.

2 Claims, 3 Drawing Sheets

REEL-TYPE PACKAGE OF FLEXIBLE PRINTED CIRCUIT BOARDS AND METHOD FOR SUPPLYING THEREOF

RELATED APPLICATIONS

This application is a Division of currently application U.S. Ser. No. 10/462,629, entitled "REEL-TYPE PACKAGE OF FLEXIBLE PRINTED CIRCUIT BOARDS AND METHODS FOR SUPPLYING THEREOF" and filed on Jun. 17, 2003, now abandoned.

FIELD OF THE INVENTION

The present invention relates to an approach to packaging flexible printed circuit boards (FPCs) and, more specifically, to a design of depositing flexible printed circuit boards by reel-type packaging and a method for supplying flexible printed circuit boards in a subsequent chip on glass (COG) mounting procedure.

BACKGROUND OF THE INVENTION

A flexible printed circuit board is one of the most complicated and multi-functional products in printed circuit boards (PCBs). The flexible printed circuit board is widely applied in various electronic products, such as notebook computers, mobile phones, liquid crystal displays (LCDs), hard discs, printers, cameras, and automobiles, etc. because it has the characteristics of smaller size, less weight, flexibility, lower voltage and lower power consumption, and it is suitable for three-dimensional wiring distribution according to the size and shape of the inner space of the electronic product. For example, the flexible printed circuit board can directly adhere onto the glass substrate of the liquid crystal display through the COG mounting process to be electrically connected with the pixel electrodes and driving circuits.

In the current LCD related processes, the FPC suppliers usually transport and supply the flexible printed circuit boards using piece-type packaging. The suppliers generally first define tens of FPC patterns in a flexible plate and then cut out FPCs one piece by one piece through the cutting procedure. FIG. 1 shows a conventional flexible plate 12 having FPC patterns 10 before cut. As shown in FIG. 1, the FPC patterns 10 on the flexible plate 12 are arranged in pairs. Two pieces of adjacent FPCs are in one unit and the neighboring sides of these two pieces of FPCs are partially connected.

Referring to FIG. 2, which is a top view of a tray 14 carrying the FPCs in pairs, the flexible plate 12 is cut and the FPCs are cut down one pair by one pair. Afterwards, the suppliers deposit these FPCs 10 in pairs on the tray 14 so as to perform a transporting process. There are tens of matrixes of recesses on the top surface of the tray 14 for receiving these FPCs 10 in pairs. As shown in FIG. 2, the tray 14 has about 50 bar-like recesses in each of which two pieces of partially connected FPCs 10 are deposited.

Hence, the suppliers can transport the FPCs 10 by piece-type packaging to the LCD manufacturers through the carrying of the trays 14, and it is convenient for the related machinery to take the FPCs 10 directly from the tray 14. In a typical supplying mode, as shown in FIG. 3, about twenty trays 14 are stacked in a feeding division of a processing machine. Thereafter, referring to FIG. 4, a sucking device 16 of the processing machine can suck the FPCs 10 in pairs out of the tray 14, put them on a transporting arm 18 and precisely identify their locations.

Subsequently, the FPCs 10 in pairs are transported to the processing machine by the transporting arm 18. Then, the FPCs 10 are sucked up by a pre-press head 20 and sent into a process chamber. After the marks for locating the FPCs 10 are precisely identified, the FPCs 10 are adhesively pressed onto the surface of a glass substrate 22. As shown in FIG. 4, a color filter 24 and a large scale integration (LSI) chip 26 have been fabricated on the surface of the glass substrate 22 in advance.

However, there are many disadvantages in such piece-type FPCs packaging/supplying. First, after the suppliers cut out the FPCs 10 one pair by one pair using a puncher, it spends quite a lot of time and labor to regularly arrange these FPCs 10 one by one in the tray 14. Besides, when the tray 14 is pressed or knocked by an external force during transportation, it often leads the FPCs 10 in the tray 14 to scatter and make displacement, as shown in FIG. 5. That might result in crumples, curves and deformation of the FPCs. Once this situation occurs, it frequently requires to rearrange and inspect these FPCs 10.

Furthermore, as shown in FIG. 3, the FPCs 10 are transported into the feeding division of the processing machine with the tray 14. However, the stack of the trays 14 has up to twenty three trays and the amounts of the FPCs supplied are only about 1150 pieces. For the current processing machine, it is necessary to re-supply after about two hours. Therefore, it brings burdens to on-line operators and greatly reduces the throughput of the entire process.

SUMMARY OF THE INVENTION

An objective of the present invention is to provide a method of reel-type packaging FPCs.

Another objective of the present invention is to provide a design of reel-type FPCs supplying to adhesively press the FPCs onto a glass substrate.

A method for depositing FPCs is disclosed in this invention, wherein a plurality of aligned FPC patterns are first defined on a bar-like flexible plate and the bar-like flexible plate is wound onto a reel so as to prevent the FPCs from crumpling, curving and deforming when suffering an external force.

Furthermore, a supplying method for related processes is also provided in this invention. Such a process system for adhesively pressing FPCs on a glass substrate includes a FPCs reel-type package, a punching device, a transporting arm and a pre-press head. The FPCs reel-type package is formed by winding bar-like materials having a plurality of aligned FPC patterns onto a reel one by one. The punching device can cut out the bar-like materials sequentially to produce a plurality of the FPCs. The transporting arm can suck the FPCs cut out by the punching device and transport them to a positioning device. The pre-press head is disposed above the positioning device and can suck the FPCs, transport them to the top of a glass substrate and press the FPCs on the surface of the glass substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

This invention provides a method for reel-type packaging FPCs to replace the piece-type packaging in which the FPCs are carried by the trays in the prior art. Firstly, a plurality of aligned FPC patterns are defined on a bar-like flexible plate, and then the bar-like flexible plate is wound onto a reel so as to prevent the FPCs from crumpling, curving and deforming when suffering an external force. Subsequently, the bar-like flexible plate is cut in the process of supplying to form a FPC piece by piece and the FPCs are transported piece by piece to a processing machine to be adhesively pressed onto a glass substrate. The best mode of the present invention is illustrated below in detail.

Figure 1:
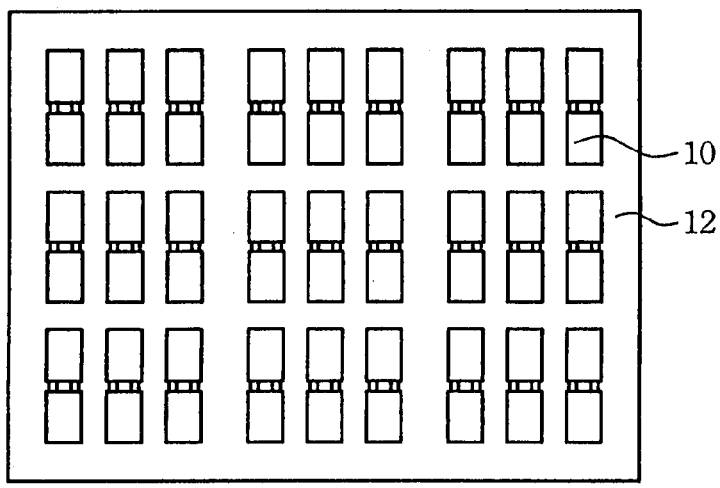
FIG. 1 is a schematic top view of a flexible plate having FPC patterns 10 before cut in the prior art.
Figure 2:
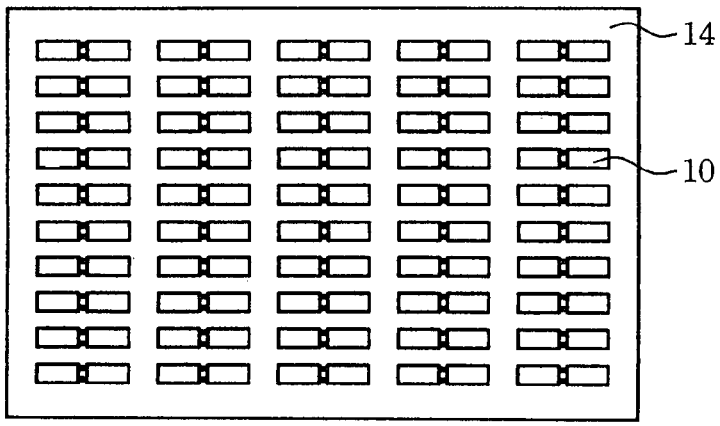
FIG. 2 is a top view of a tray carrying the FPCs in pairs.
Figure 3:
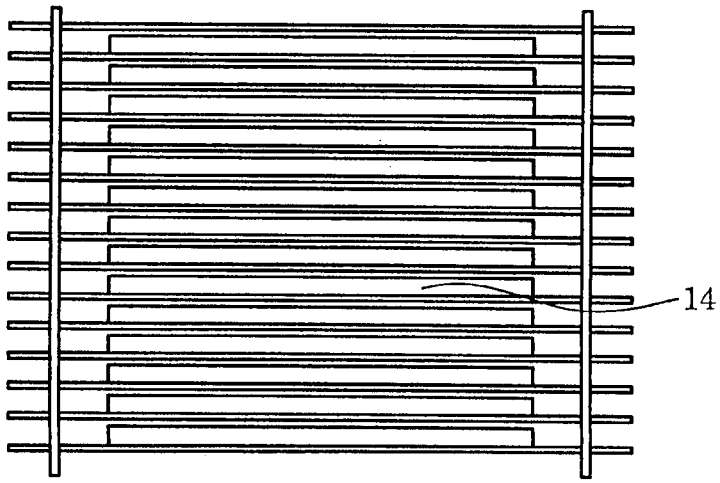
FIG. 3 is a schematic sectional view showing the manner of supplying the FPCs in a conventional process; wherein about twenty trays are stacked in a feeding division of a processing machine.
Figure 4:
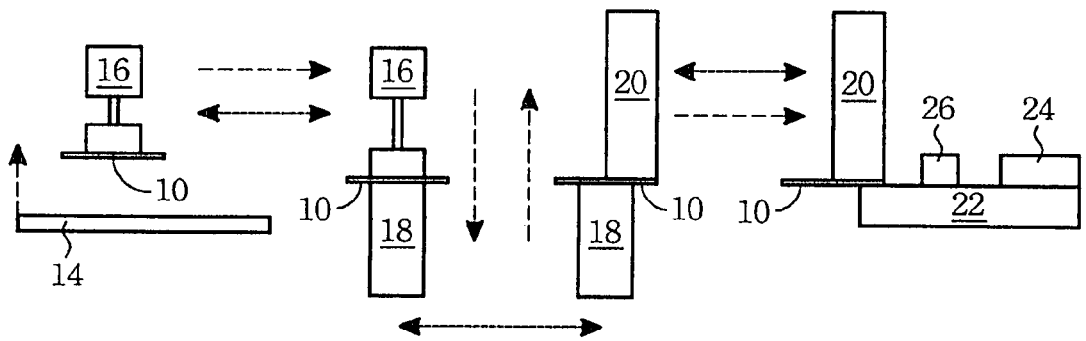
FIG. 4 shows that in the conventional process, the FPCs are sucked out of the tray and are transported to the processing machine by a transporting arm.
Figure 5:
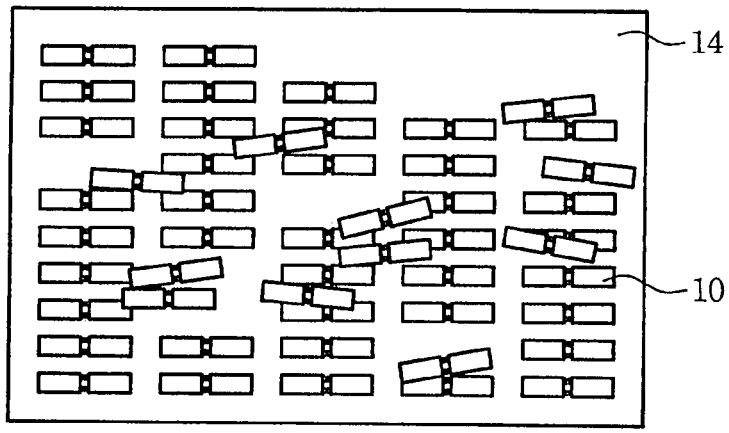
FIG. 5 shows that in the conventional process, the tray is pressed or knocked by an external force and the FPCs in the tray are caused to scatter and make displacement to result in crumples, curves and deformation of the FPCs.
Figure 6:
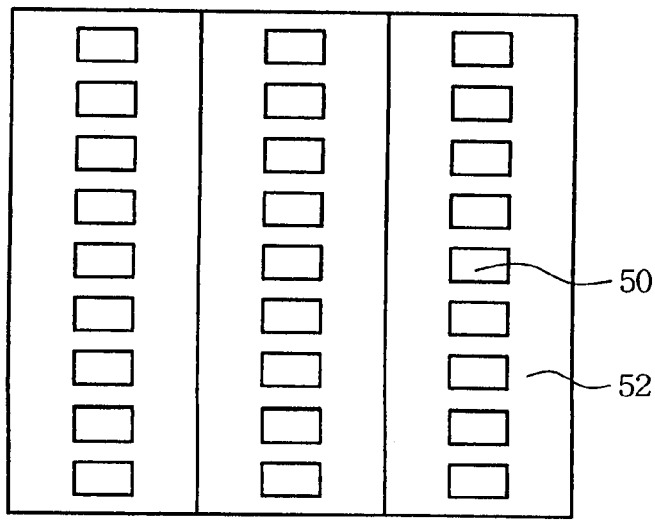
FIG. 6 is a schematic top view of a flexible plate having FPC patterns before cut in accordance with this invention.

In order to facilitate depositing the FPCs by reel-type packaging, this invention provides a design of arranging a plurality of FPC patterns on a flexible plate. Please refer to FIG. 6, which is a schematic top view of such a flexible plate 52 having the FPC patterns 50 before cut. The major difference from the conventional flexible plate 12 is that the FPC patterns 50 in this invention are independently arranged on the flexible plate 52 in sequence, rather than distributed in pairs. As shown in FIG. 6, there are three columns of aligned FPC patterns 50.

Figure 7:
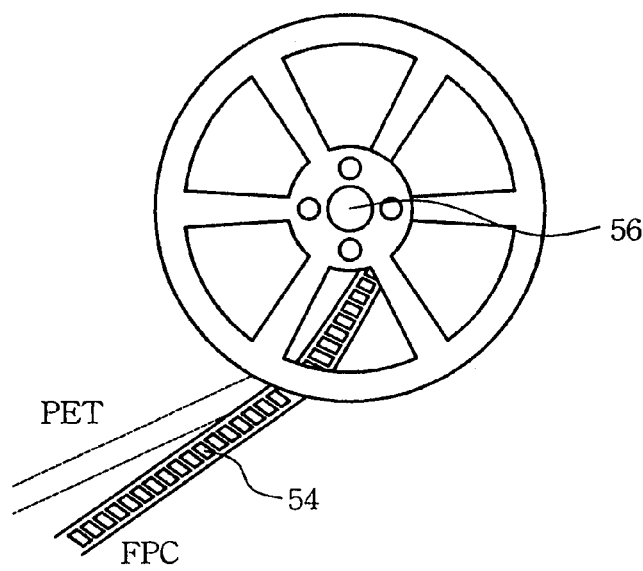
FIG. 7 shows a reel-type package formed by winding bar-like materials having the FPC patterns onto a reel in accordance with this invention.

Thereafter, the flexible plate 52 having a plurality of FPC patterns 50 is cut out to form three bar-like materials 54, wherein each of the bar-like materials has a plurality of aligned FPC patterns 50, i.e. a multiple pieces of the FPCs. Referring to FIG. 7, these bar-like materials 54 are wound onto a reel 56 one by one to form a reel-type package which can therefore prevent the FPCs distributed on the bar-like materials 54 from crumpling, curving or deforming when suffering an external force. Preferably, an antistatic cushion can be used to pad the bar-like material 54 while wound onto the reel 56. Hence, the antistatic cushion is wound together with the bar-like material 54 so as to prevent undesired static occurred between different FPCs.

Figure 8:
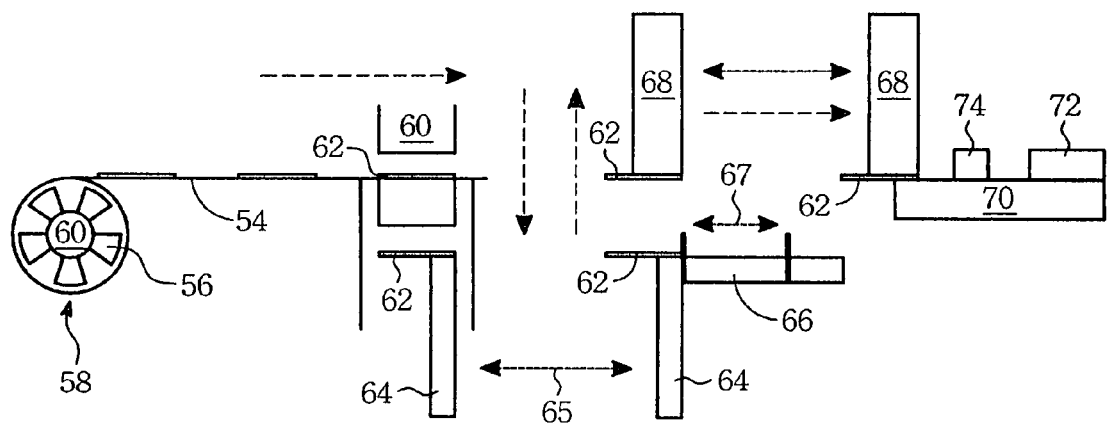
FIG. 8 shows a reel-type supplying method for supplying the FPCs to perform the related processes in accordance with a process system of this invention.

The FPCs reel-type packaging can effectively prevent crumples and deformation of the FPCs caused by an external force and provide a convenient supplying method employed in the process for binding these FPCs onto the glass substrate to largely increase throughput. Referring to FIG. 8, the process system of this invention includes a FPCs reel-type package 58 which is formed by winding the bar-like materials 54 having a plurality of FPC patterns onto the reel 56 one by one. Furthermore, a punching device 60 located in front of the reel 56 sequentially cuts the bar-like material 54 transported under the punching device 60 to produce a multiple pieces of FPCs 62. A transporting arm 64 located below the punching device 60 can suck the bottom surface of one piece of the FPCs 62 cut off by the punching device 60 and go back and forth between a positioning area and the punching device 60, as shown by a dotted arrow 65 so as to transport each piece of the cut out FPCs 62 to the positioning area. When the transporting arm 64 moves to the positioning area and touches a positioning device 66, the transporting arm 64 reaches a precise identified location. As shown in FIG. 8, the positioning device 66 can move along a dotted arrow 67 to adjust a specific identified location based on different process conditions.

Once the transporting arm 64 is positioned, a pre-press head 68 located above the transporting arm 64 can suck the top surface of the FPC 62 and transport it to the top of a glass substrate 70 and press the FPC 62 on the surface of the glass substrate 70. Generally before this process, a desired color filter 72 and a LSI chip 74 have been defined and fabricated on the surface of the glass substrate 70. Therefore, after transporting the FPC 62 on the top of the glass substrate 70, the pre-press head 68 adhesively presses the FPC 62 beside the LSI chip 74 according to the mark for locating the FPC 62 on the surface of the glass substrate 70.

Comparing with the conventional piece-type packaging, the FPCs reel-type packaging and the related supplying method provided in this invention have the following advantages:

1. A lot of costs on time and labor can be saved since it is not necessary for this invention to cut out the FPCs in pairs and arrange them onto the tray in sequence as the conventional piece-type packaging does;

2. In this invention, the bar-like materials having the FPCs after padded with antistatic cushions are directly wound onto the reel one by one to form a reel-type package. Therefore, in the process of transporting or supplying, the FPCs in this invention can be well protected from crumples, curves and deformation which are liable to occur in the conventional tray packaging; and 3. The total supplying amount of the FPCs by the reel-type packaging can increase up to 6000 pieces per time and another reel-type package is needed to supply only per seven hours. However, the total supplying amount per time by the conventional tray supplying with the piece-type package is only 1150 pieces and it is needed to re-supply about per two hours. Therefore, this invention can further reduce the labor cost and enhance the throughput of the entire process.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed:

1. A supplying method for a processing machine to adhesively press flexible printed circuit boards on a glass substrate, comprising:

providing a package of flexible printed circuits boards formed by winding strip materials having a plurality of said flexible printed circuit boards one by one onto a reel;

transporting said strip materials to a punching device;

cutting said strip material along the periphery of one of said flexible printed circuit boards on said strip material by said punching device to form a piece of flexible printed circuit board; and transporting said piece of flexible printed circuit boards to said processing machine, wherein a layer of an antistatic cushion is padded on a top surface of said strip material while said strip material is to be wound onto said reel and then is wound together with said strip material.

2. The supplying method of claim 1, wherein a color filter and a large scale integration chip have been defined on the surface of said glass substrate before said flexible printed circuit board is adhesively pressed on said glass substrate.

* * * * *